United States Patent
Masuda et al.

(10) Patent No.: US 6,962,870 B2
(45) Date of Patent: Nov. 8, 2005

(54) METHOD OF MANUFACTURING SEMICONDUCTOR DEVICE AND SEMICONDUCTOR DEVICE

(75) Inventors: Hideaki Masuda, Kanagawa-ken (JP); Hideshi Miyajima, Kanagawa-ken (JP); Rempei Nakata, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/757,534

(22) Filed: Jan. 15, 2004

(65) Prior Publication Data

US 2004/0175930 A1 Sep. 9, 2004

(30) Foreign Application Priority Data

Jan. 17, 2003 (JP) ..................................... P2003-010133

(51) Int. Cl.⁷ .......................................... H01L 21/4763
(52) U.S. Cl. ...................... 438/624; 438/637; 438/687; 257/759; 257/760; 257/762; 257/E23.145
(58) Field of Search ................................ 438/623, 624, 438/637, 638, 687, 622; 257/759, 760, E23.145, E23.161, E23.167, 758, 762

(56) References Cited

U.S. PATENT DOCUMENTS

| | | | |
|---|---|---|---|
| 6,287,973 B2 | | 9/2001 | Aoi |
| 6,515,365 B2 | * | 2/2003 | Higashi et al. ............. 257/758 |
| 6,525,428 B1 | * | 2/2003 | Ngo et al. ................... 257/774 |
| 6,737,744 B2 | * | 5/2004 | Fukuyama .................. 257/750 |
| 6,783,862 B2 | * | 8/2004 | Hedrick et al. ............. 428/447 |
| 2004/0094839 A1 | * | 5/2004 | Fitzsimmons et al. ...... 257/758 |

FOREIGN PATENT DOCUMENTS

JP          2003-100866          4/2003

OTHER PUBLICATIONS

Hasegawa et al.; "Copper Dual Damascene Interconnects with Low–K ($K_{EFF}$ 21 3.0) Dielectrics Using Flare™ and an Organo–Silicate Hard Mask"; International Electron Devices Meeting (IEDM), pp. 623–626, (1999).

* cited by examiner

*Primary Examiner*—Trung Dang
(74) *Attorney, Agent, or Firm*—Finnegan, Henderson, Farabow, Garrett & Dunner, L.L.P.

(57) ABSTRACT

A method of manufacturing a semiconductor device comprising forming a protective film on a surface of a lower-layer interconnection, and forming a multilayer-structured film by stacking a first porous film, a first non-porous film, a second porous film, and a second non-porous film on a surface of the protective film in this order, and forming a via hole and an interconnect trench. After a resist mask is removed, protective film exposed at a bottom of the via hole is removed. An upper-layer interconnection of dual damascene structure is formed by embedding an interconnect material in the via hole and the interconnect trench.

The first non-porous film includes a first layer has a high etching selectivity ratio relative to the protective film, and a second layer has a high etching selectivity ratio relative to the resist mask and the second porous film.

16 Claims, 10 Drawing Sheets

METHOD OF MANUFACTURING SEMICONDUCTOR DEVICE AND SEMICONDUCTOR DEVICE

CROSS-REFERENCE TO RELATED APPLICATIONS

This application is based upon and claims the benefit of priority from the prior Japanese Patent Application No. 2003-010133, filed Jan. 17, 2003, the entire contents of which are incorporated herein by reference.

FIELD OF THE INVENTION

The present invention relates to a method of manufacturing a semiconductor device and the semiconductor device in which multilayer interconnections are formed using a dual damascene process.

BACKGROUND OF THE INVENTION

In recent years, techniques for reducing interconnect resistance and interline capacitance have been developed to achieve higher performance of semiconductor devices. As one of the techniques for reducing interconnect resistance, known is copper metallization using a damascene process. A so-called dual damascene process, in which interconnections and via plugs are simultaneously formed, is particularly effective in reducing interconnect resistance.

Since interconnections are formed in interlayer dielectrics, low-k interlayer dielectrics are used to reduce interconnect resistance. For example, a low-k interlayer dielectric with a relative dielectric constant of 2.5 or less has been desired. Specifically, a dual damascene process using a film of a porous material has been developed.

A porous film has such characteristics that the properties thereof are changed through a dry etching process and that the etching rate thereof is higher than that of a non-porous film. Etching control on porous films is very difficult. When an interlayer dielectric consisting of a porous film is used in a dual damascene process, in a step of etching to form the shapes of interconnections, portions of the porous film located at the bottoms of the interconnections are particularly changed in properties. Unnecessary excessive etching of the porous film leads to difficulty in forming multilayer interconnections having desired properties.

In 'Copper Dual Damascene Interconnects with Low-K (Keff<3.0) Dielectrics Using FLARE and Organo-Silicate Hard Mask' International Electron Devices Meeting (IEDM) 1999, pp. 623, described is a method in which an etching stopper film is provided between a porous film where via plugs are located and a porous film where interconnections are located. This etching stopper film is a non-porous film which has a high etching selectivity ratio relative to the porous films. The etching stopper film facilitates the etching control on the porous films and prevents changes in properties of the porous films. The etching stopper film protects the porous film located at the bottoms of the interconnections from being etched more than needed. For the etching stopper film, SiCH film, SiCN film, or an organic film is used.

Each of the above-mentioned films is similar, in composition, to a resist mask and a passivation film (protective film) formed on surfaces of interconnections (e.g., embedded interconnections) immediately below upper-layer interconnections of dual damascene structures. In steps of removing the resist mask and the passivation film at the bottoms of via holes, the etching stopper film is also etched. The porous film is exposed at the bottoms of the interconnections, and it becomes difficult to form via plugs to designed dimensions.

The etching stopper film is made thick so that the etching stopper film is left at a sufficient thickness even after the steps of removing the respective members. SiCH film, SiCN film, or an organic film used for the etching stopper film has a higher dielectric constant than that of a porous film. The use of a thick etching stopper film will lead to an increase in interline capacitance.

SUMMARY OF THE INVENTION

A method of manufacturing semiconductor device according to an embodiment of the present invention comprises forming a lower-layer interconnection, forming a protective film on a surface of the lower-layer interconnection, forming a multilayer-structured film by stacking a first porous film, a first non-porous film, a second porous film, and a second non-porous film on a surface of the protective film in this order, forming a via hole in the first porous film and the first non-porous film, and forming an interconnect trench communicating with the via hole in the second porous film and the second non-porous film, by dry etching the multilayer-structured film using a resist mask, removing the resist mask, removing the protective film exposed at a bottom of the via hole after removing the resist mask, and forming an upper-layer interconnection of dual damascene structure by embedding an interconnect material in the via hole and the interconnect trench, the upper-layer interconnection being connected to the lower-layer interconnection, wherein for the first non-porous film, used is a multilayer film including at least two layers in which a first layer, which is located close to the first porous film, is made of a material that has a high etching selectivity ratio relative to the protective film, and a second layer, which is located closer to the second porous film than the first layer is, is made of a material that has a high etching selectivity ratio relative to the resist mask and the second porous film.

Further, method of manufacturing semiconductor device according to another embodiment of the present invention comprises forming a lower-layer interconnection, forming a protective film on a surface of the lower-layer interconnection, forming a multilayer-structured film by stacking a first porous film, a first non-porous film, a second porous film, and a second non-porous film on a surface of the protective film in this order, forming a via hole in the first porous film and the first non-porous film, and forming an interconnect trench communicating with the via hole in the second porous film and the second non-porous film, by dry etching the multilayer-structured film using a resist mask, removing the protective film exposed at a bottom of the via hole, removing the resist mask after removing the protective film, and forming an upper-layer interconnection of dual damascene structure by embedding an interconnect material in the via hole and the interconnect trench, upper-layer interconnection being connected to the lower-layer interconnection, wherein for the first non-porous film, used is a multilayer film including at least two layers in which a first layer, which is located close to the first porous film, is made of a material that has a high etching selectivity ratio relative to the resist mask, and a second layer, which is located-closer to the second porous film than the first layer is, is made of a material that has a high etching selectivity ratio relative to the protective film and the second porous film.

Further, a semiconductor device according to another embodiment of the present invention comprises a lower-layer interconnection formed on a semiconductor substrate with an insulating film interposed therebetween, a protective film formed on a surface of the insulating film, including on the lower-layer interconnection, a multilayer-structured film formed by stacking at least a first porous film, a first non-porous film, and a second porous film on a surface of the protective film in this order, and an upper-layer interconnection of dual damascene structure formed in the protective film and the multilayer-structured film, the upper-layer interconnection including a via plug part connected to the lower-layer interconnection with a boundary of the first non-porous film and an interconnect part connected to the via plug, wherein the first non-porous film is a multilayer film including at least two layers, the first non-porous film including any one of the layers is made of a material which has a high etching selectivity ratio relative to the protective film, a layer located close to the first porous film is made of a material which has a high etching selectivity ratio relative to a layer located close to the second porous film, and a layer located close to the second porous film is made of a material which has a high etching selectivity ratio relative to the second porous film.

DETAILED DESCRIPTION OF THE INVENTION (First Embodiment)

Hereinafter, a description will be given of a method of manufacturing a semiconductor device and the semiconductor device according to a first embodiment of the present invention with reference to FIGS. 1A to 6B.

(First Step)

Embedded interconnections (lower-layer interconnections) are formed in an insulating film on a semiconductor substrate so that surfaces of the interconnections are partially exposed.

Figure 1A:
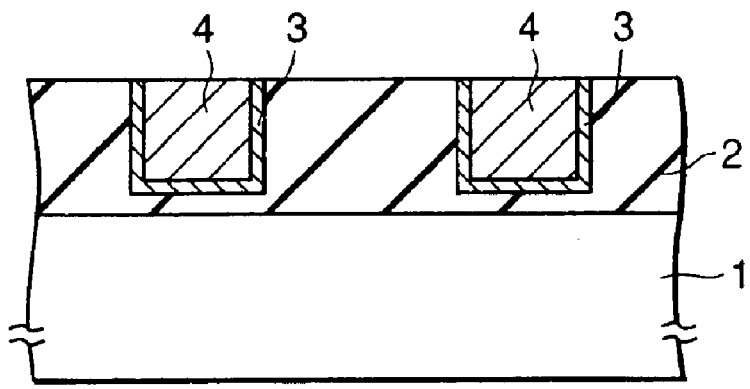
FIGS. 1A to 1C are sectional views showing manufacturing steps of a semiconductor device according to a first embodiment of the present invention.

As shown in FIG. 1A, an insulating film 2 made of, e.g., $SiO_2$ is formed on a semiconductor substrate 1, and trenches for the embedded interconnections are formed. A TiN film 3, which is an electrically conductive barrier film, is formed on a surface of insulating film 2. Embedded copper interconnections (lower-layer connections) 4, which are wrapped in TiN film 3, are formed. Surfaces of these embedded copper interconnections 4 are exposed.

The embedded interconnections are, for example, formed as follows: interconnect trenches are formed in an insulating film; interconnect material is embedded in these interconnect trenches; and excessive part of the interconnect material is removed by a chemical mechanical polishing (CMP) process.

For insulating film 2, for example, a borophosphosilicate glass (BPSG) film, a phosphosilicate glass (PSG) film, SiOF, organic spin-on-glass, polyimide, a porous film (film of a porous material), or the like may be used.

For the interconnect material of the embedded interconnections, for example, a Cu alloy such as Cu—Si alloy, Cu—Al alloy, Cu—Si—Al alloy or Cu—Ag alloy, or Al or an Al alloy such as Al—Si alloy, Al—Cu alloy or Al—Si—Cu alloy, may be used. When Cu or Cu alloy is used for the interconnect material, it is preferable to form the embedded interconnections in the insulating film so that each embedded interconnection is wrapped in the electrically conductive barrier film. For the electrically conductive barrier film, for example, Ta film, TaN film, Ti film, or the like may be used.

(Second Step)

Figure 1B:
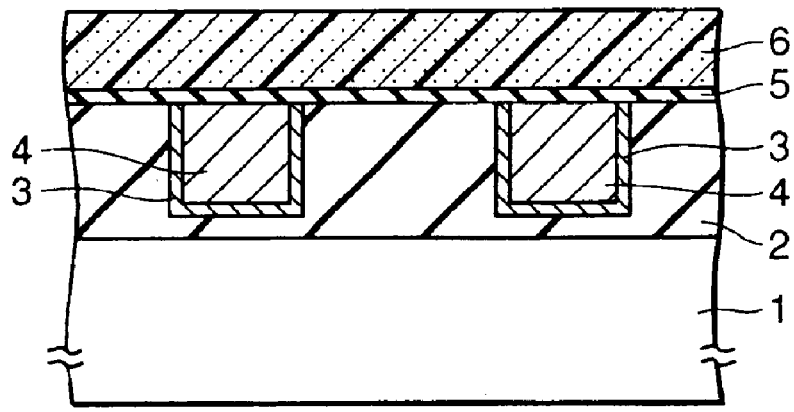

As shown in FIG. 1B, a 50 nm thick SiCN film (protective film) 5 is formed on a surface of insulating film 2 including embedded copper interconnections 4 with the planarized surfaces. A 100 nm thick porous organic siloxane film (first porous film) 6 is formed on a surface of protective film 5.

Figure 1C:
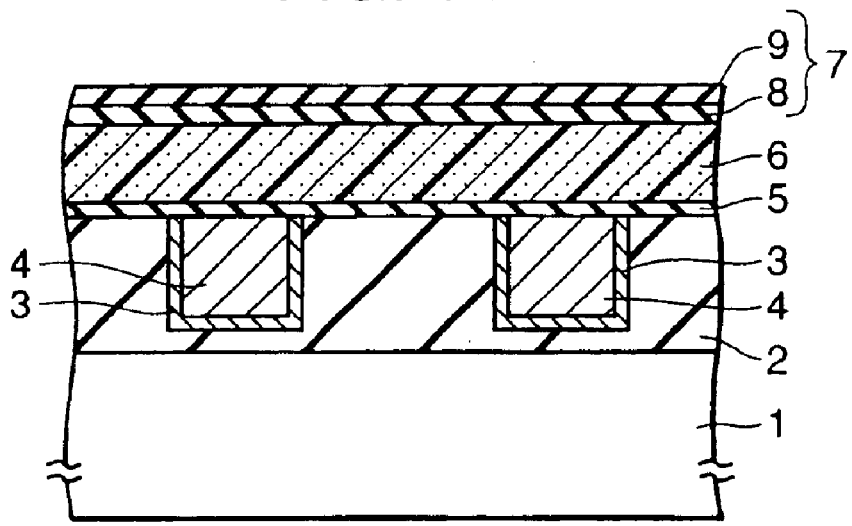

As shown in FIG. 1C, a first non-porous film 7 is formed on a surface of first porous film 6. First non-porous film 7 is a multilayer film including a first layer (lower layer) 8 made of a material which has a high etching selectivity ratio relative to protective film 5, and a second layer (upper layer) 9 made of a material which has a high etching selectivity ratio relative to resist masks and a second porous film, which are described later. First layer 8 is made of, for example, a polyarylene ether film formed to a thickness of 30 nm on the surface of first porous film 6. Second layer 9 is made of, for example, a SiCH film stacked to a thickness of 10 nm on first layer 8. First non-porous film 7 has a total thickness of 40 nm.

Figure 2D:
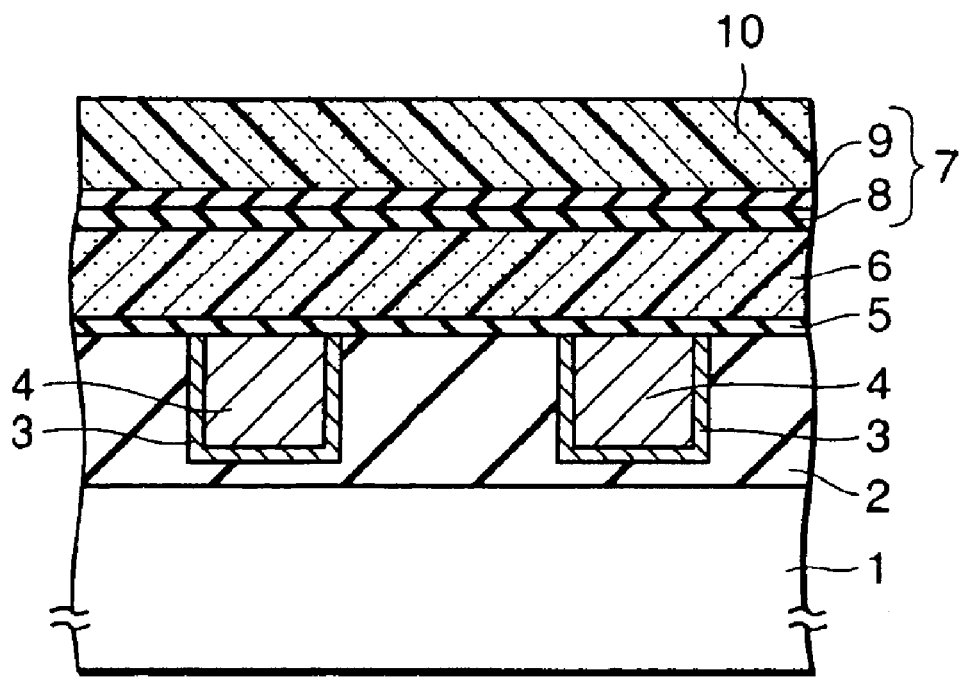
FIGS. 2D and 2E are sectional views showing manufacturing steps of the semiconductor device according to the first embodiment of the present invention.

As shown in FIG. 2D, a 100 nm thick porous organic siloxane film (second porous film) 10 is formed on a surface of second layer 9 of first non-porous film 7.

Figure 2E:
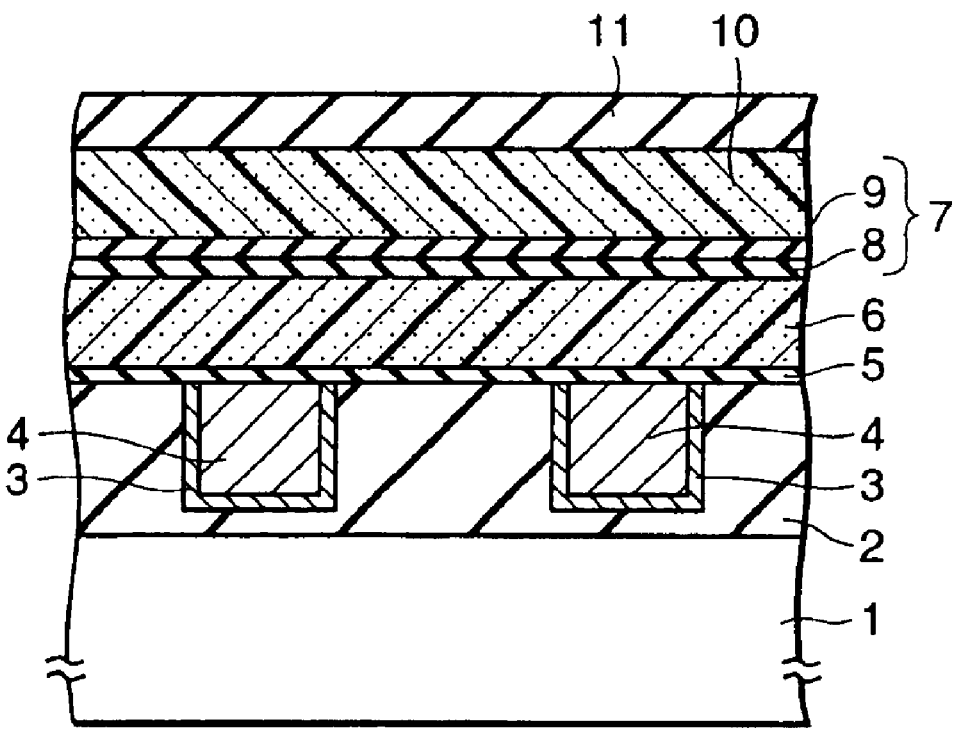

As shown in FIG. 2E, a 200 nm thick organic siloxane film (second non-porous film) 11 is formed on a surface of second porous film 10.

As described above, a multilayer-structured film is formed on the surface of protective film 5 by stacking first porous film 6, first non-porous film 7, second porous film 10, and second non-porous film 11.

When the first porous film is etched, the protective film shields the embedded interconnections immediately below the protective film from an etching atmosphere, as described later. The protective film prevents the surfaces of the embedded interconnections from being roughened, thereby achieving good electrical connectivity between the embedded interconnections and via plugs. The protective film acts as an etching stopper when the first porous film immediately above the protective film is etched, as described later.

The protective film is made of a material which has a high etching selectivity ratio relative to the first porous film. For example, the protective film may be formed of a film with one layer or two layers selected from a group consisting of SiCH, SiCO and SiN.

Each of the first and second porous films preferably has such a low relative dielectric constant of 2.5 or less. For example, porous organic siloxane film such as porous methylsiloxane film, porous inorganic siloxane film, or porous polyarylene ether film is used.

The first non-porous film is a multilayer film including at least two layers. The first non-porous film may be constituted of a multilayer film including three or more layers. The first layer is located at a first porous film side (lower layer side). This first layer is made of a material which has a high etching selectivity ratio relative to the protective film. The second layer is located at a second porous film side (upper layer side). This second layer is made of a material which has a high etching selectivity ratio relative to the second porous film and the resist masks used when the multilayer-structured film is etched.

For the first layer, for example, polyarylene ether film is used. This polyarylene ether film has a relative dielectric constant of about 4.0, which is lower than that of a non-porous film such as a nitride film, and can reduce interline capacitance.

For the second layer, for example, SiCN film, SiCO film, SiN film, organic siloxane film, or inorganic siloxane film may be used.

The total thickness of the multilayer film is preferably set to 20 to 50 nm to reduce the interline capacitance.

The second non-porous film protects the underlying second porous film. Specifically, the second non-porous film protects the second porous film in undermentioned steps of dry etching to remove resist masks, and in an undermentioned step of chemical mechanical polishing (CMP) to remove excessive part of interconnect material. For this second non-porous film, for example, organic siloxane film or inorganic siloxane film is used.

(Third Step)

By dry etching processes using resist masks, via holes are formed in the first porous film and the first non-porous film, and trenches communicating with the via holes are formed in the second porous film and the second non-porous film.

Specifically, the via holes and the interconnect trenches are formed by any one of two methods, which are described below.

(1) In a first method, a resist mask in which portions to be the via holes are opened, is formed on a surface of the multilayer-structured film. Exposed portions of the multilayer-structured film out from the resist mask are selectively etched and removed by a first dry etching process, thus opening holes in via hole shapes with the bottoms reaching the protective film. The resist mask is then removed.

A resist mask in which portions to be the interconnect trenches are opened, is formed on the surface of the multilayer-structured film. Exposed portions of the multilayer-structured film out from the resist mask are selectively etched and removed by a second dry etching process. The first non-porous film functions as an etching stopper for the first porous film, and the first porous film is not etched. Only the second non-porous film and the second porous film are selectively etched and removed to form the shapes of the interconnect trenches.

Through these two dry etching processes, the via holes are formed in the first porous film and the first non-porous film, and the interconnect trenches communicating with the via holes are formed in the second porous film and the second non-porous film.

A detailed description thereof will be given with reference to the drawings.

A resist mask 12 is formed on the surface of second non-porous film 11 of the multilayer-structured film shown in FIG. 2E. Portions to be the via holes in resist mask 12 are opened by using a photoetching technique. Exposed portions of the multilayer-structured film out from resist mask 12 are selectively etched and removed by a dry etching process.

Figure 3F:
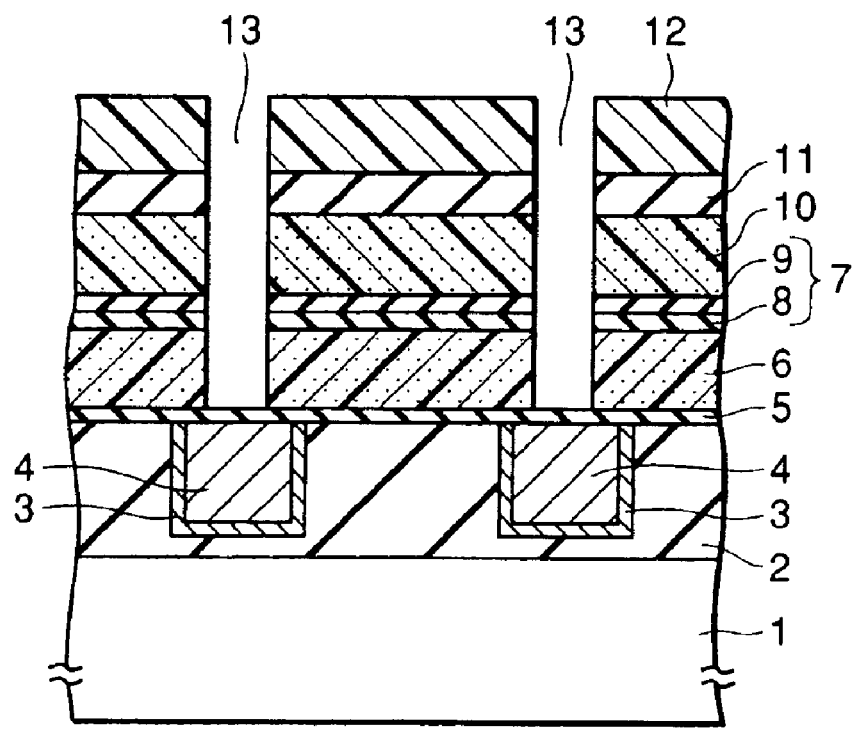
FIGS. 3F and 3G are sectional views showing manufacturing steps of the semiconductor device according to the first embodiment of the present invention.

As shown in FIG. 3F, via-hole-shaped holes 13 are opened. The bottoms of via-hole-shaped holes 13 reach protective film 5. In this dry etching process, a fluorocarbon etching gas is used when first and second non-porous films 7 and 11 and first and second porous films 6 and 10 are etched.

Etching conditions are changed between when etching first and second porous films 6 and 10 and when etching first and second non-porous films 7 and 11.

For example, the etching conditions for the first non-porous film are changed from those for the first and second porous films (porous organic siloxane films) in etching gas, gas flow rate, RF power, and chamber pressure. When etching second layer 9 (SiCH) of the first non-porous film, a different kind of fluorocarbon gas from that used when etching first and second porous films 6 and 10, is used. When etching first layer 8 (polyarylene) of the first non-porous film, a gas such as $O_2$, $H_2O$, or $N_2/H_2$ may be used as well as a $NH_3$ gas.

For example, the etching conditions for second non-porous film 11 (organic siloxane) are changed in gas flow rate, RF power, and chamber pressure.

Resist mask 12 is removed by a dry etching process using oxygen plasma. During this dry etching process, second non-porous film 11 can protect the surface of second porous film 10.

A resist mask 14 is formed on the surface of second non-porous film 11 of the multilayer-structured film. Portions to be the interconnect trenches in resist mask 14 are opened by a photoetching technique. Exposed portions of the multilayer-structured film out from resist mask 14 are selectively etched and removed by a dry etching process. Second layer 9 of the upper layer of first non-porous film 7 is made of SiCH. SiCH has a high etching selectivity ratio relative to resist mask 14 and second porous film 10.

During the second etching process, second layer 9 functions as an etching stopper for first porous film 6 therebelow. First porous film 6 is not exposed to an etching gas and therefore not changed in properties and not etched. Second non-porous film 11 and second porous film 10 are selectively etched and removed to form the shapes of the interconnect trenches.

Figure 3G:
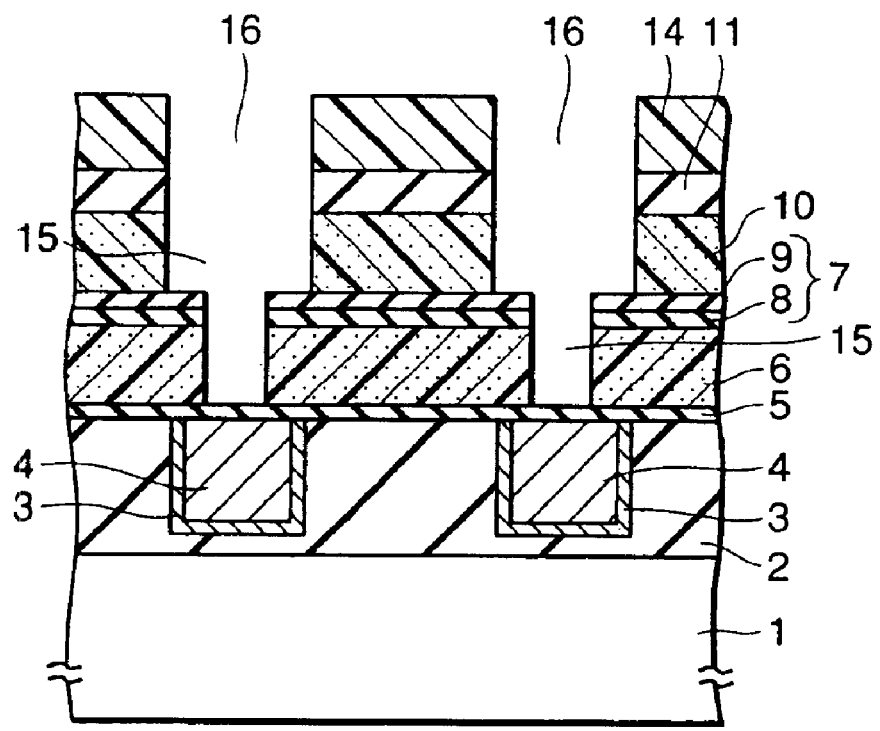

Through the above steps, as shown in FIG. 3G, via holes 15 are formed in first porous film 6 and first non-porous film 7, and interconnect trenches 16 communicating with these via holes 15 are formed in second porous film 10 and second non-porous film 11.

In the dry etching process, when etching second non-porous film 11 and second porous film 10, a fluorocarbon etching gas is used. The etching conditions may or may not be changed between when etching second non-porous film 11 and when etching second porous film 10.

During the formation of via holes 15 and interconnect trenches 16 through the two dry etching processes, the surfaces of embedded interconnections 4 in insulating film 2 are covered with protective film 5. This can prevent the surfaces of embedded interconnections 4 from being exposed to the etching gases used in the dry etching processes and thus from being roughened.

During the two dry etching processes, the surface of second porous film 10 is covered with second non-porous film 11. This can prevent second porous film 10 from being changed in properties and etched by the etching gases used in those processes.

(2) In the first method, after the via-hole-shaped holes were opened by the dry etching process, the interconnect trenches were formed by the dry etching process. The via holes may be opened after the interconnect trenches are formed, as described below.

In a second method, a resist mask in which portions to be the interconnect trenches are opened, is formed on the surface of the multilayer-structured film. Exposed portions of the multilayer-structured film out from the resist mask are selectively etched and removed by a first dry etching process. The first non-porous film functions as an etching stopper for the first porous film, and the first porous film is not etched. Only the second non-porous film and the second porous film are selectively etched and removed to form the shapes of the interconnect trenches. The resist mask is then removed.

A resist mask in which portions to be the via holes are opened, is formed on the surface of the multilayer-structured film including the interconnect trenches. Exposed portions of the first non-porous film and of the first porous film out from the resist mask are selectively etched and removed by a second dry etching process. Thus, the via holes the bottoms of which reach the protective film are opened.

A detailed description thereof will be given with reference to the drawings.

Figure 6A:
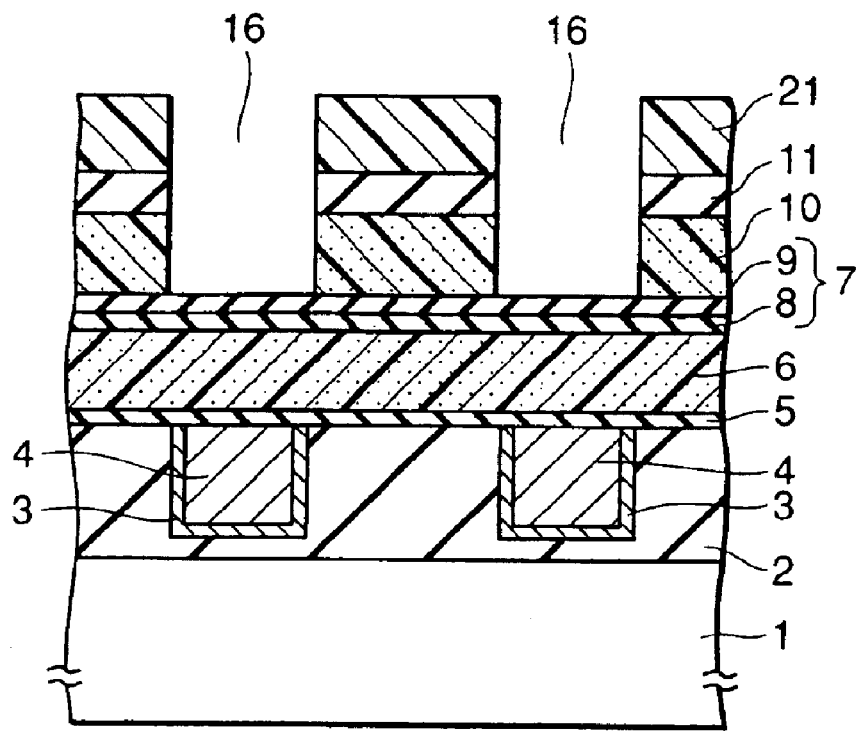
FIGS. 6A and 6B are sectional view showing other steps of forming via holes and interconnect trenches according to the first embodiment of the present invention.

As shown in FIG. 6A, a resist mask 21 is formed on the surface of second non-porous film 11 of the multilayer-structured film. In resist mask 21, portions to be the interconnect trenches are opened by a photoetching technique. Exposed portions of the multilayer-structured film out from resist mask 21 are selectively etched and removed by a dry etching process. Second layer 9 of first non-porous film 7 is made of SiCH. SiCH has a high etching selectivity ratio relative to resist mask 21 and second porous film 10.

During the etching process, second layer 9 functions as an etching stopper for first porous film 6 therebelow. First porous film 6 is not exposed to an etching gas and therefore not changed in properties and not etched. Only second non-porous film 11 and second porous film 10 are selectively etched and removed, and interconnect trenches 16 are thus formed.

In the dry etching process, when etching second non-porous film 11 and second porous film 10, a fluorocarbon etching gas is used. The etching conditions are changed between when etching second non-porous film 11 and when etching second porous film 10.

Resist mask 21 is removed by a dry etching process using oxygen plasma. During the dry etching process, second layer 9 of first non-porous film 7 functions as an etching stopper. Second non-porous film 11 can protect the surface of second porous film 10.

A resist mask 22 is formed on the surface of second non-porous film 11 of the multilayer-structured film including interconnect trenches 16. In resist mask 22, portions to be the via holes are opened by a photoetching technique. Exposed portions of first non-porous film 7 and of first porous film 6 out from resist mask 22 are selectively etched by a dry etching process.

Figure 6B:
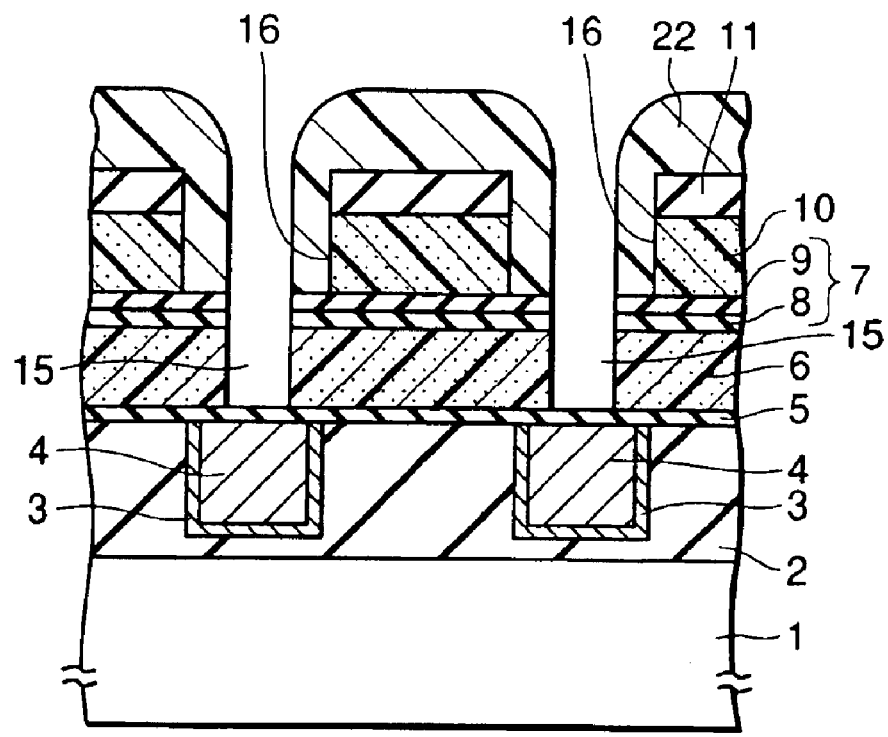

As shown in FIG. 6B, via holes 15 are formed in first porous film 6 and first non-porous film 7, and via holes 15 communicate with interconnect trenches 16.

In the dry etching process, when etching first non-porous film 7 and first porous film 6, a fluorocarbon etching gas is used. The etching conditions are changed between when etching first non-porous film 7 and when etching first porous film 6.

For example, the etching conditions for first porous film 6 are changed in etching gas, gas flow rate, RF power, and chamber pressure from those for first non-porous film 7. When etching second layer 9 (SiCH) of first non-porous film 7, a different kind of fluorocarbon gas from that used when etching first porous film 6, is used. When etching first layer 8 (polyarylene) of first non-porous film 7, a gas such as $O_2$, $H_2O$, or $N_2/H_2$ may be used as well as a $NH_3$ gas.

Through these two dry etching processes, similarly to the first method, the via holes are formed in the first porous film and the first non-porous film, and the interconnect trenches communicating with the via holes are formed in the second porous film and the second non-porous film.

During the formation of the via holes and the interconnect trenches through the two dry etching processes, the surfaces of the embedded interconnections in the insulating film are covered with the protective film. This prevents the surfaces of the embedded interconnections from being exposed to the etching gases used in the dry etching processes and thus from being roughened.

During the two dry etching processes, the surface of the second porous film is covered with the second non-porous film. This can prevent the second porous film from being changed in properties and etched by the etching gases used in those dry etching processes.

(Fourth Step)

Figure 4H:
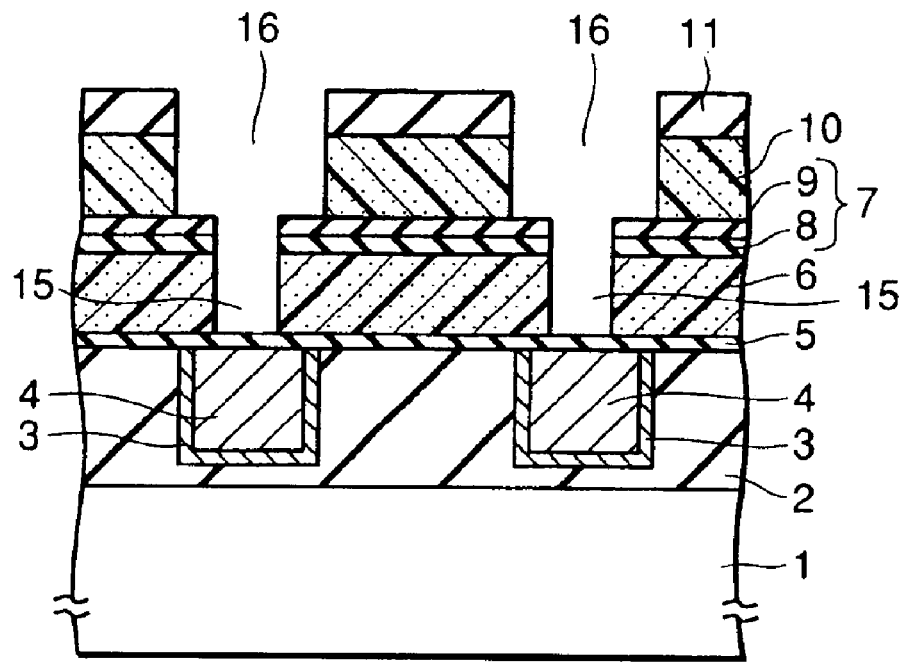
FIGS. 4H and 4I are sectional views showing manufacturing steps of the semiconductor device according to the first embodiment of the present invention.

Resist mask 14 (or 22) is removed by a dry etching process using oxygen plasma. Second layer 9 of the upper layer of first non-porous film 7 functions as an etching stopper while resist mask 14 (or 22) is removed. As shown in FIG. 4H, resist mask 14 (or 22) can be removed without first porous film 6 being exposed to an etching gas to be changed in properties and to be etched.

During the removal of resist mask 14 (or 22), the surfaces of embedded interconnections 4 in insulating film 2 are covered with protective film 5. This prevents the surfaces of embedded interconnections 4 from being exposed to an atmosphere of the etching gas (e.g., oxygen containing gas) of the dry etching process. The surfaces of embedded interconnections 4 can be prevented from being roughened.

(Fifth Step)

Figure 4I:
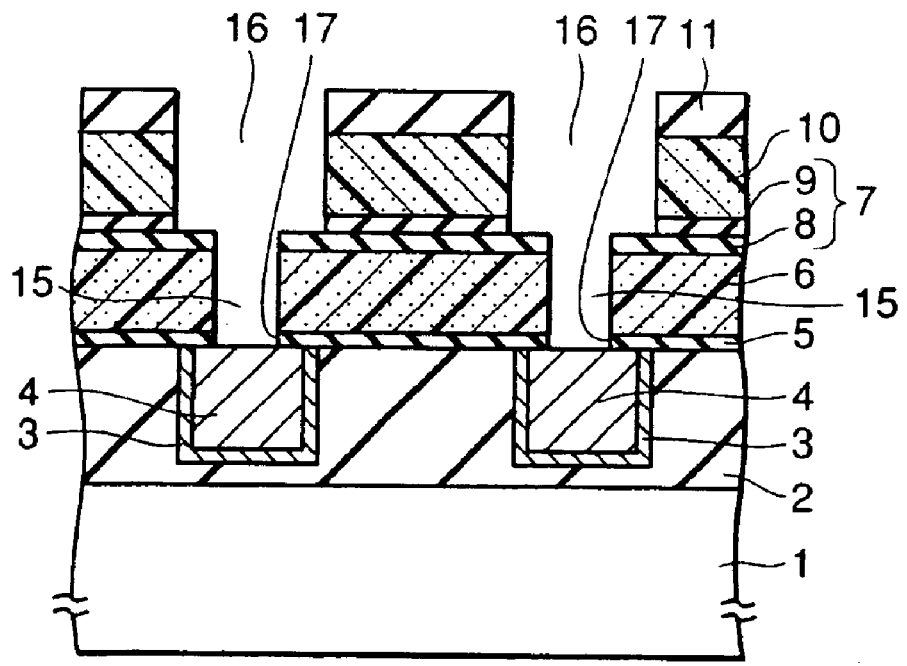

As shown in FIG. 4I, protective film 5 exposed at the bottoms of via holes 15 is removed by a dry etching process. Windows 17 are opened for allowing the bottoms of via holes 15 to communicate with embedded interconnections 4.

A fluorocarbon gas is used for an etching gas. First layer 8 of first non-porous film 7 has a high etching selectivity ratio relative to protective film 5. When removing protective film 5, second layer 9 exposed at the bottoms of interconnect trenches 16 is etched, while first layer 8 functions as an etching stopper. Protective film 5 is selectively removed without first porous film 6 being changed in properties and etched.

During the dry etching processes in the fourth and fifth steps, the surface of second porous film 10 is covered with second non-porous film 11. This can prevent the surface of second porous film 10 from being changed in properties and etched by the etching gases used in those dry etching processes.

(Sixth Step)

Figure 5J:
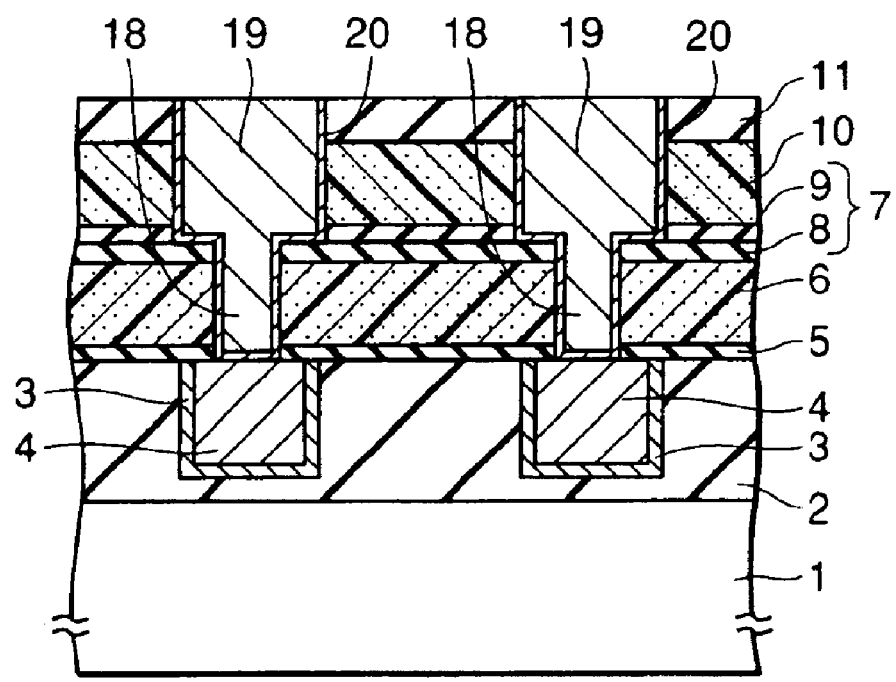
FIG. 5J is a sectional view showing a manufacturing step of the semiconductor device according to the first embodiment of the present invention.

As shown in FIG. 5J, a TiN film, which is an electrically conductive barrier film, is formed on inner faces of via holes 15 and interconnect trenches 16. Cu (interconnect material) is embedded by sputtering and plating methods. Excessive part of the Cu, and the TiN film on the surface of second non-porous film 11 are removed by a chemical mechanical polishing process. Thus, upper-layer interconnections of dual damascene structures are formed in protective film 5 and the multilayer-structured film, and a semiconductor device is manufactured.

Each upper-layer interconnection of the dual damascene structure includes a via plug part 18, an interconnect part 19, and TiN film 20. Via plug parts 18 are connected to embedded interconnections (lower-layer interconnections) 4. Via plug parts 18 are formed in protective film 5 and first porous film 6 with a boundary of first non-porous film 7. Interconnect parts 19 are connected to via plug parts 18. Interconnect parts 19 are formed in second porous film 10 and second non-porous film 11 with the boundary of first non-porous film 7. TiN films 20 wrap via plug parts 18 and interconnect parts 19.

During the formation of the upper-layer interconnections, the surface of second porous film 10 is covered with second non-porous film 11. The surface of second porous film 10 is not directly chemical-mechanical polished and thus can be prevented from being changed in properties and from being roughened. In the chemical mechanical polishing process, in order to reduce the interline capacitance, the process may be continued until second non-porous film 11 of the multilayer-structured film is removed.

For the interconnect material, for example, a Cu alloy such as Cu—Si alloy, Cu—Al alloy, Cu—Si—Al alloy or Cu—Ag alloy, or Al, or an Al alloy such as Al—Si alloy, Al—Cu alloy or Al—Si—Cu alloy, may be used. When Cu or a Cu alloy is used for the interconnect material, it is preferable to form the upper-layer interconnections in the via holes and the interconnect trenches so that each upper-layer interconnection is wrapped in the electrically conductive barrier film. For the electrically conductive barrier film, for example, Ta film, TaN film, Ti film, or the like may be used as well as TiN film.

According to the first embodiment described above, the following operations and effects are achieved.

The upper-layer interconnections of dual damascene structures are formed in an interlayer insulating films including first and second porous films 6 and 10, which are fragile and easy to be changed in properties. The dual damascene structures according to the first embodiment are highly reliable. It is possible to manufacture a semiconductor device in which interline capacitance, which is attributable to first non-porous film 7 functioning as an etching stopper, is reduced. Specifically, there are following operations and effects.

1) In the dry etching process to form the interconnect trenches, it is possible to use the second layer of the first non-porous film as an etching stopper for the first porous film. When the interconnect trenches are selectively formed by dry etching the second non-porous film and the second porous film, a change in properties of the first porous film, and unnecessary excessive etching can be avoided.

The first and second porous films are used as interlayer insulating films. The resist masks are used to form the via holes and the interconnect trenches in these interlayer insulating films. In the dry etching processes to remove these resist masks, it is possible to use the second layer of the first non-porous film as an etching stopper for the first porous film at the bottoms of the interconnect trenches. In the dry etching process to remove the protective film exposed at the bottoms of the via holes, it is possible to use the first layer of the first non-porous film as an etching stopper for the first porous film at the bottoms of the interconnect trenches. In these dry etching processes, the first porous film can be prevented from being exposed to etching gases. A change in properties of the first porous film, and unnecessary excessive etching can be avoided.

In the dry etching processes to remove the resist masks and the protective film exposed at the bottoms of the via holes, the surface of the second porous film is covered with the second non-porous film. This can prevent the surface of the second porous film from being changed in properties and etched by the etching gases used in those dry etching processes.

The interconnect material is embedded in the via holes and the interconnect trenches. Excessive part of the interconnect material is removed by the chemical mechanical polishing process. In these steps, by covering the surface of the second porous film with the second non-porous film, it is possible to prevent the surface of the second porous film from being directly chemical-mechanical polished. It becomes possible to prevent the surface from being changed in properties and from being roughened.

It is possible to manufacture a semiconductor device in which highly reliable multilayer interconnections of dual damascene structures are formed in the interlayer insulating films including the first and second porous films, which are fragile and easy to be changed in properties.

2) In general, a non-porous film causes interline capacitance to increase because it has a higher dielectric constant than that of a porous film. The first non-porous film is constituted as least of the first and second layers each of which is made of a material having the etching selectivity ratio as described above. Accordingly, even if the thickness of the first non-porous film is less than the thickness of each resist mask or of the protective film, the first porous film located at the bottoms of the interconnect trenches is not exposed. It is therefore possible to form desired upper-layer interconnections of dual damascene structures. The total thickness of the first non-porous film made of a multilayer film including at least the first and second layers, can be reduced in comparison with the case where a single-layered non-porous film is used as an etching stopper. It is therefore possible to manufacture a semiconductor device in which interline capacitance is effectively reduced. It becomes possible to further reduce the interline capacitance by forming the first layer of the first non-porous film from low-k polyarylene ether, which has a relative dielectric constant of about 4.0.

3) In the dry etching processes to form the via holes and the interconnect trenches, the surfaces of the embedded interconnections in the insulating film are covered with the protective film. This can prevent the surfaces of the embedded interconnections from being exposed to the etching gases, and thus from being roughened.

When the resist masks are removed by the dry etching processes, the surfaces of the embedded interconnections in the insulating films are covered with the protective film. This can prevent the surfaces of the embedded interconnections from being exposed to the etching gases, and thus from being roughened.

It is possible to manufacture a semiconductor device in which the via plugs of the upper-layer interconnections are electrically connected to the embedded interconnections (lower-layer interconnections) in good manner.

(Second Embodiment)

Hereinafter, a description will be given of a method of manufacturing a semiconductor device and a semiconductor device according to a second embodiment of the present invention with reference to FIGS. 7A to 10G.

(First Step)

An insulating film 32 made of, e.g., $SiO_2$ is formed on a semiconductor substrate 31, and trenches for the embedded interconnections are formed. A TiN film 33, which is an electrically conductive barrier film, is formed on a surface of insulating film 32. Embedded copper interconnections (lower-layer interconnections) 34 wrapped in TiN film 33 are formed. Surfaces of these embedded copper interconnections 34 are partially exposed. The embedded interconnections are formed by removing excessive part of interconnect material through a chemical mechanical polishing (CMP) process.

For materials of the insulating film and of the embedded interconnections, similar materials to those described in the first embodiment are used. When Cu or Cu alloy is used as the interconnect material, it is preferable to form the embedded interconnections in the insulating film so that each embedded interconnection is wrapped in the electrically conductive barrier film. For the electrically conductive barrier film, for example, Ta film, TaN film, or Ti film may be used.

(Second Step)

Figure 7A:
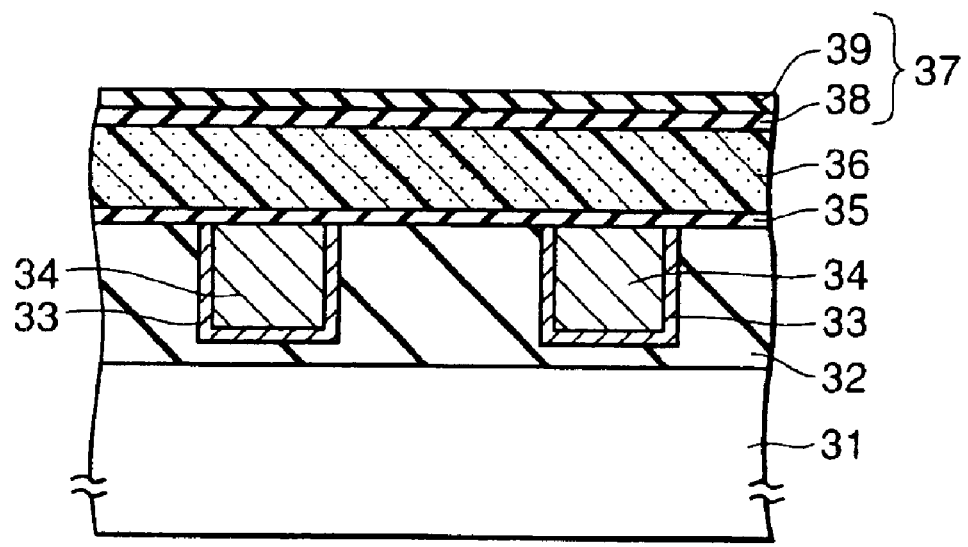
FIGS. 7A and 7B are sectional views showing manufacturing steps of a semiconductor device according to a second embodiment of the present invention.

As shown in FIG. 7A, a 50 nm thick SiCN film (protective film) 35 is formed on the surface of insulating film 32 including embedded copper interconnections 34 with the planarized surfaces. A 100 nm thick porous organic siloxane film (first porous film) 36 is formed on a surface of protective film 35.

A first non-porous film 37 is formed on a surface of first porous film 36. First non-porous film 37 is a multilayer film including a first layer (lower layer) 38 made of a material which has a high etching selectivity ratio relative to resist masks, and a second layer (upper layer) 39 made of a material which has a high etching selectivity ratio relative to protective film 35 and to an undermentioned second porous film. First layer 38 is, for example, made of SiCH and formed to a thickness of 10 nm on the surface of first porous film 36. Second layer 39 is, for example, made of polyarylene ether and stacked to a thickness of 30 nm on first layer 38. First non-porous film 37 has a total thickness of 40 nm.

Figure 7B:
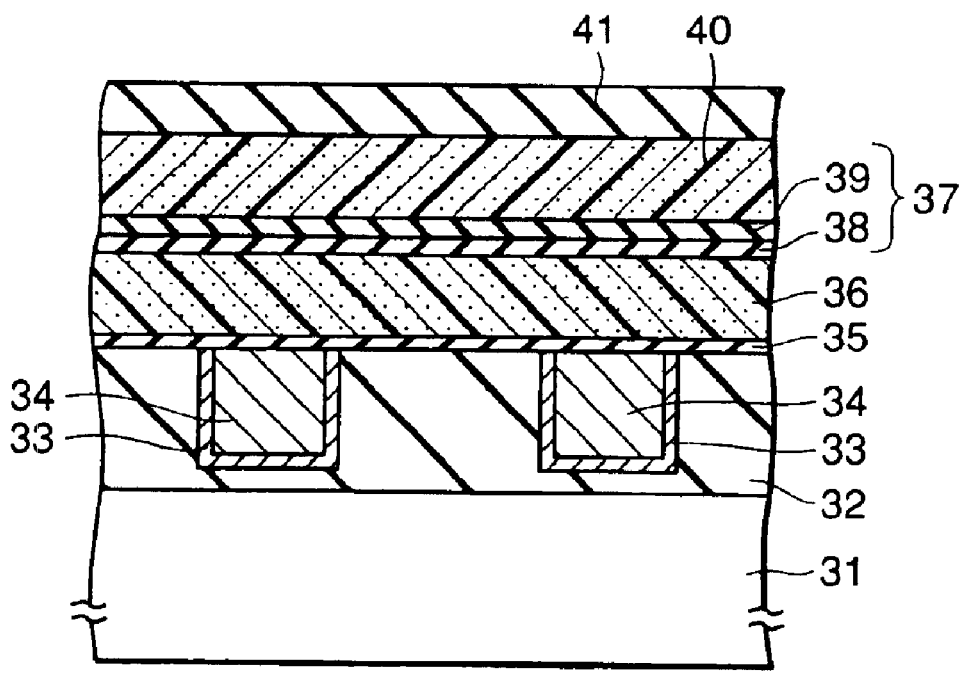

As shown in FIG. 7B, a 100 nm thick porous organic siloxane film (second porous film) 40 is formed on a surface of second layer 39 of first non-porous film 37.

A 200 nm thick organic siloxane film (second non-porous film) 41 is formed on a surface of second porous film 40.

As described above, a multilayer-structured film is formed on the surface of protective film 35 by stacking first porous film 36, first non-porous film 37, second porous film 40, and second non-porous film 41.

The protective film and the first and second porous films are made of similar materials to those described in the first embodiment. The protective film acts similarly to that described in the first embodiment.

The first non-porous film is a multilayer film including at least two layers. The first non-porous film may be constituted of a multilayer film including three or more layers. The first layer is located at a first porous film side. This first layer is made of a material which has a high etching selectivity ratio relative to the resist masks to be described later. The second layer is located at a second porous film side. This second layer is made of a material which has a high etching selectivity ratio relative to the protective film and to the second porous film.

For the first layer, for example, SiCH film, SiCN film, SiCO film, SiN film, organic siloxane film, or inorganic siloxane film is used.

For the second layer, for example, polyarylene ether film is used. This polyarylene film has a relative dielectric constant of about 4.0, which is lower than that of a non-porous film such as a nitride film, and can reduce interline capacitance. If a porous polyarylene ether film is selected as the second porous film located immediately above the second layer, it becomes difficult to ensure a sufficient etching selectivity ratio between the second layer and the second porous film. In this embodiment, for the second porous film, a porous organic siloxane film or a porous inorganic siloxane film, other than the porous polyarylene ether film, is selected. For example, a porous methylsiloxane film or the like may be selected.

It is preferable to set the total thickness of the multilayer film to 20 to 50 nm to reduce interline capacitance.

The second non-porous film is made of a similar material to that described in the first embodiment.

(Third Step)

By dry etching processes using resist masks, via holes are formed in the first porous film and the first non-porous film, and interconnect trenches communicating with the via holes are formed in the second porous film and the second non-porous film.

Specifically, the via holes and the interconnect trenches are formed by the first method of the two methods described in the third step of the first embodiment. This is because, if using the second method described in the first embodiment, the second layer of the first non-porous film may be exposed to an etching gas and etched when removing the resist mask used in the formation of the interconnect trenches.

In this method, the first non-porous film functions as an etching stopper for the first porous film, and the first porous film is not etched. Only the second porous film is selectively etched and removed to form the shapes of the interconnect trenches.

Figure 8C:
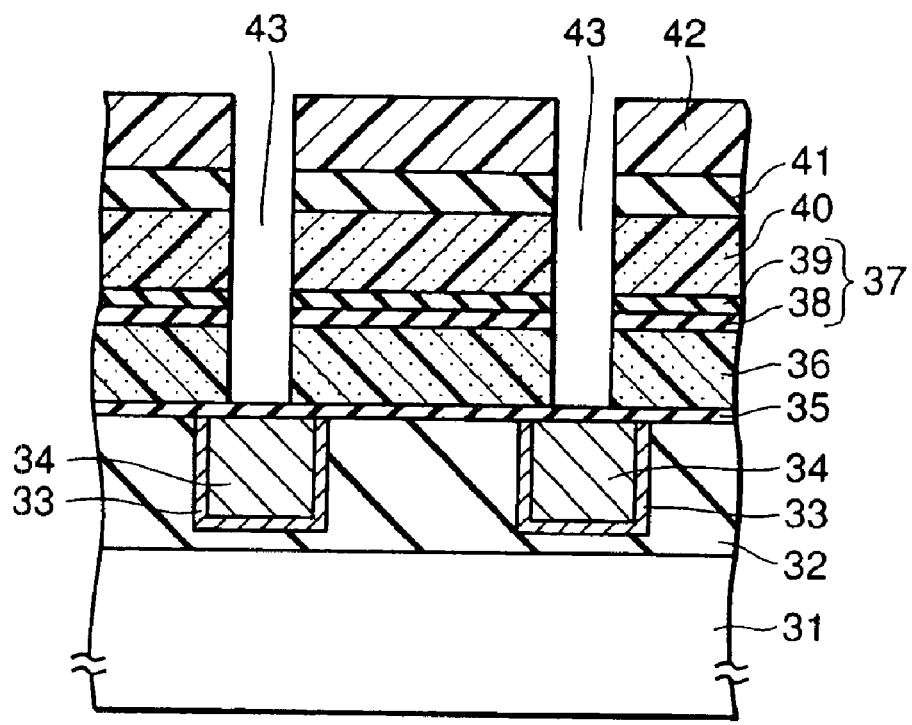
FIGS. 8C and 8D are sectional views showing manufacturing steps of the semiconductor device according to the second embodiment of the present invention.

As shown in FIG. 8C, a resist mask 42 is formed on a surface of second non-porous film 41 of the multilayer-structured film. In the resist mask 42, portions to be the via holes are opened by a photoetching technique. Exposed portions of the multilayer-structured film out from resist mask 42 are selectively etched and removed by a dry etching process.

Holes 43 in via hole shapes with the bottoms reaching protective film 35 are opened. In this dry etching process, when etching first and second non-porous films 37 and 41, and first and second porous films 36 and 40, a fluorocarbon etching gas is used. Etching conditions are changed between when etching first and second non-porous films 37 and 41 and when etching first and second porous films 36 and 40.

For example, the etching conditions for the first non-porous film are changed from those for the first and second porous films (porous organic siloxane films) in etching gas, gas flow rate, RF power, and chamber pressure.

For example, the etching conditions for second non-porous film 11 (organic siloxane) are changed in gas flow rate, RF power, and chamber pressure.

Resist mask 42 is removed by a dry etching process using oxygen plasma. During this dry etching process, second non-porous film 41 can protect the surface of second porous film 40.

A resist mask 44 is formed on the surface of second non-porous film 41 of the multilayer-structured film. In resist mask 44, portions to be the interconnect trenches are opened by a photoetching technique. Exposed portions of the multilayer-structured film out from resist mask 44 are selectively etched and removed by a dry etching process. Second layer 39 of the upper layer of first non-porous film 37 is made of polyarylene ether. Polyarylene ether has a high etching selectivity ratio relative to protective film 35 and second porous film 40. During the dry etching process, second layer 39 functions as an etching stopper for first porous film 36. First porous film 36 is not exposed to an etching gas and therefore not changed in properties and not etched. Second non-porous film 41 and second porous film 40 are selectively etched and removed to form the shapes of the interconnect trenches.

Figure 8D:
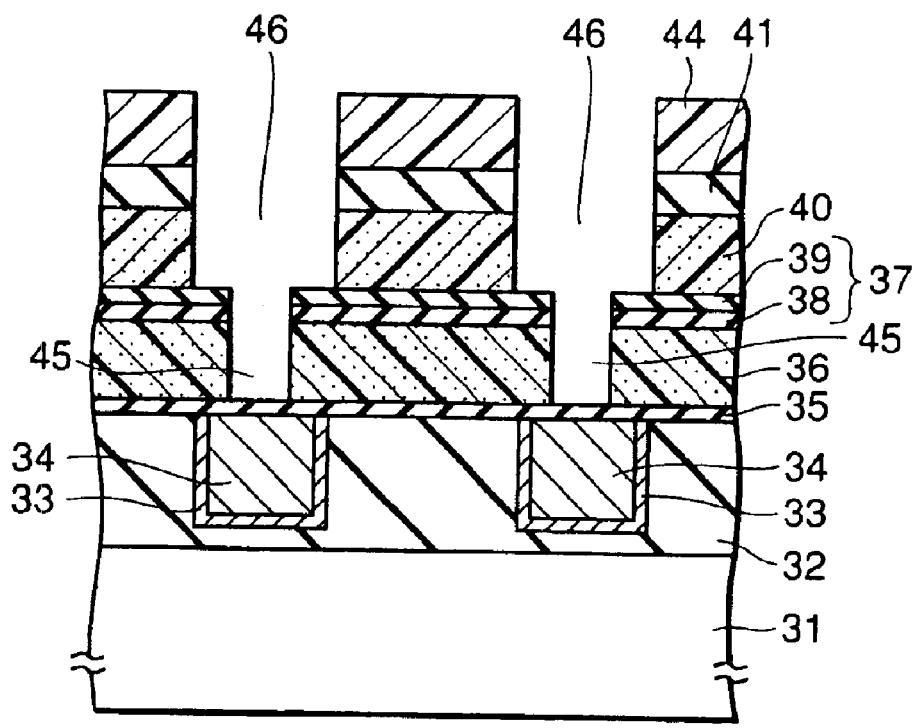

Through the above steps, as shown in FIG. 8D, via holes 45 are formed in first porous film 36 and first non-porous film 37, and interconnect trenches 46 communicating with these via holes 45 are formed in second porous film 40 and second non-porous film 41.

In the dry etching process, when etching second non-porous film 41 and second porous film 40, a fluorocarbon etching gas is used. The etching conditions may or may not be changed between when etching second non-porous film 41 and when etching second porous film 40.

During the formation of via holes 45 and interconnect trenches 46 through the two dry etching processes, the surfaces of embedded interconnections 34 in insulating film 32 are covered with protective film 35. This can prevent the surfaces of embedded interconnections 34 from being exposed to the etching gases used in the dry etching processes, and thus from being roughened.

During the two dry etching processes, the surface of second porous film 40 is covered with second non-porous film 41. This can prevent second porous film 40 from being changed in properties and etched by the etching gases used in those processes.

(Fourth Step)

Figure 9E:
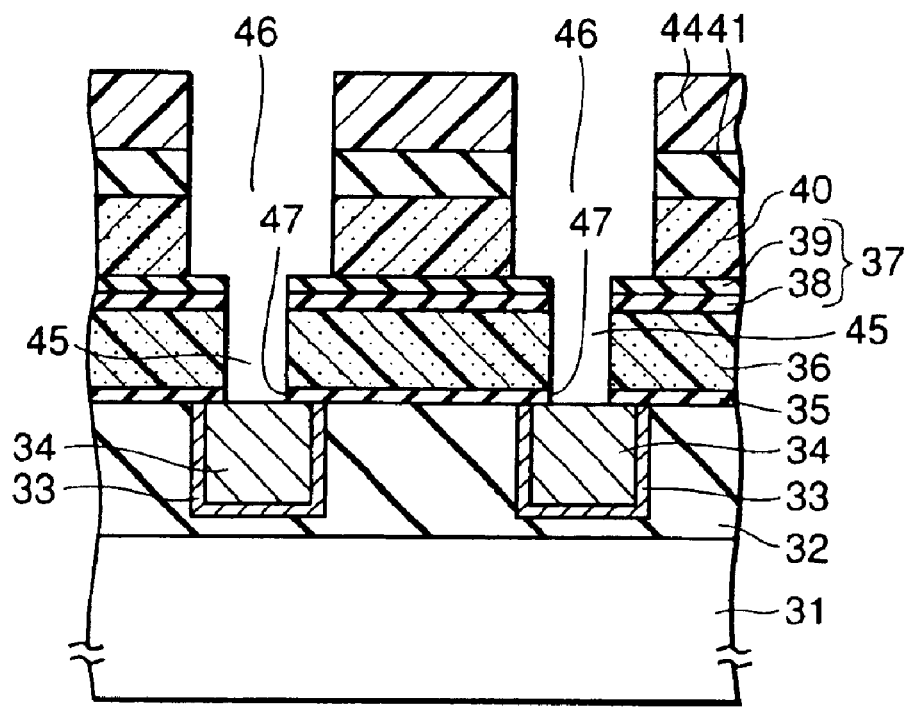
FIGS. 9E and 9F are sectional views showing manufacturing steps of the semiconductor device according to the second embodiment of the present invention.

As shown in FIG. 9E, in a state where resist mask 44 remains, a dry etching process is performed using a fluorocarbon etching gas. Protective film 35 exposed at the bottoms of via holes 45 is removed by the dry etching process. Windows 47 for allowing the bottoms of via holes 45 to communicate with embedded interconnections 34, are opened.

Second layer 39 is made of a material which has a high etching selectivity ratio relative to protective film 35. Therefore, when removing protective film 35, second layer 39 functions as an etching stopper. Protective film 35 is selectively removed without first porous film 36, positioned under first non-porous film 37 including second layer 39, being changed in properties and etched.

(Fifth Step)

Figure 9F:
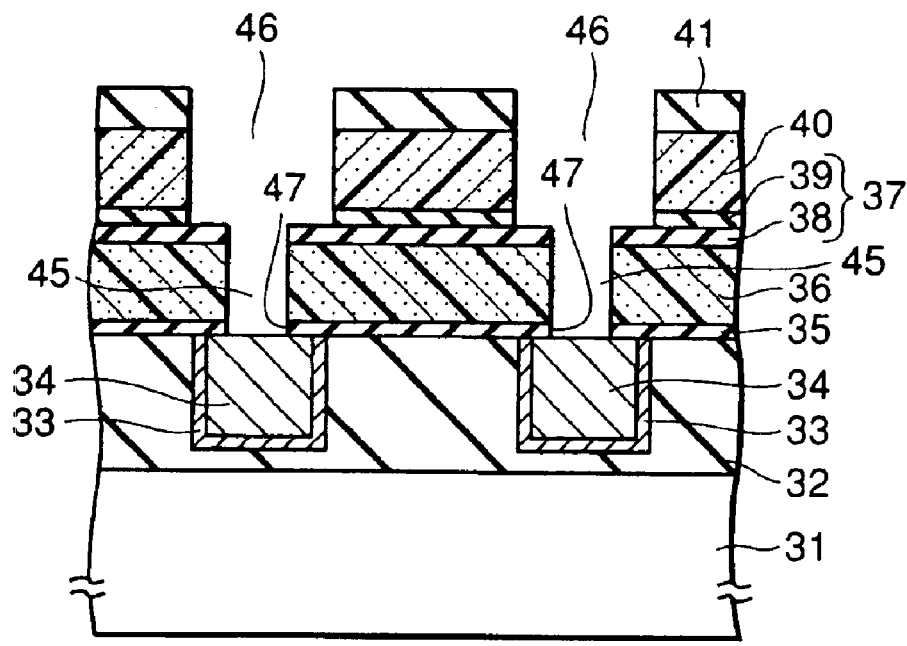

As shown in FIG. 9F, resist mask 44 is removed by a dry etching process using an etching gas containing 100 vol % ammonia. First layer 38 of first non-porous film 37 exposed at the bottoms of interconnect trenches 46, is made of SiCH which has a high etching selectivity ratio relative to resist mask 44. When removing resist mask 44, although second layer 39 exposed at the bottoms of interconnect trenches 46 is etched, first layer 38 functions as an etching stopper.

Resist mask 44 can be removed without first porous film 36, positioned under first non-porous film 37 including first layer 38, being exposed to the etching gas to be changed in properties and to be etched.

In the dry etching process in the step of removing the resist mask, it is preferable to use an etching gas selected from a group consisting of nitrogen, hydrogen, ammonia, and a combination thereof. By such a dry etching process, it is possible to prevent the surfaces of the embedded interconnections from being roughened in the step of removing the resist mask.

In the step of removing the resist mask, the protective film exposed at the bottoms of the via holes has already been removed. The surfaces of the embedded interconnections are exposed. The surfaces of the embedded interconnections may be exposed to an atmosphere of the etching gas and may be roughened. The resist mask is removed by the dry etching process using an etching gas of nitrogen, hydrogen, ammonia, or a combination thereof. Thus, it is possible to prevent the surfaces of embedded interconnections 34, which are exposed out from windows 47 opened in the fourth step, from being roughened.

During the dry etching processes in the fourth and fifth steps, the surface of second porous film 40 is covered with second non-porous film 41. This can prevent the surface of second porous film 40 from being changed in properties and etched by the etching gases used in those dry etching processes.

(Sixth Step)

Figure 10G:
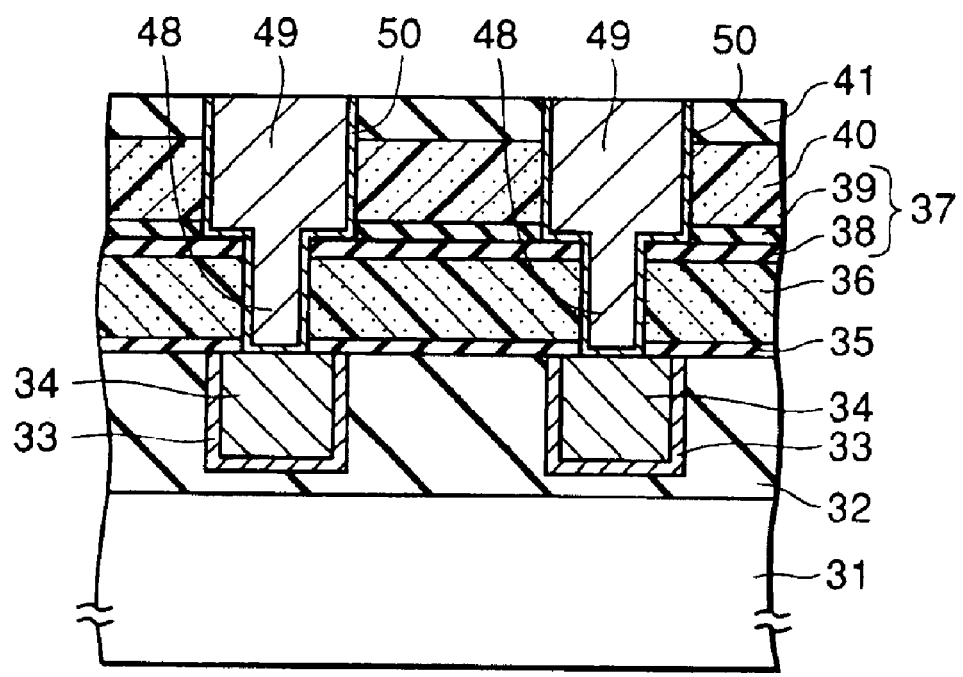
FIG. 10G is a sectional view showing a manufacturing step of the semiconductor device according to the second embodiment of the present invention.

As shown in FIG. 10G, a TiN film, which is an electrically conductive barrier film, is formed on inner surfaces of via holes 45 and interconnect trenches 46. Cu (interconnect material) is embedded by sputtering and plating methods. Excessive part of the Cu, and the TiN film on the surface of second non-porous film 41 are removed by a chemical mechanical polishing process. Upper-layer interconnections of dual damascene structures are formed in protective film 35 and the multilayer-structured film, thus manufacturing a semiconductor device.

Each upper-layer interconnection of the dual damascene structure includes a via plug part 48, an interconnect part 49, and TiN film 50. Via plug parts 48 are connected to embedded interconnections 34. Via plug parts 48 are formed in protective film 35 and first porous film 36 with a boundary of first non-porous film 37. Interconnect parts 49 are connected to via plug parts 48. Interconnect parts 49 are formed in second porous film 40 and second non-porous film 41 with the boundary of first non-porous film 37. TiN films 50 wrap via plug parts 48 and interconnect parts 49.

During the formation of the multilayer interconnections, the surface of second porous film 40 is covered with second non-porous film 41. The surface of second porous film 40 is not directly chemical-mechanical polished. Therefore, the surface of second porous film 40 can be prevented from being changed in properties and from being roughened. The chemical mechanical polishing process may be continued until second non-porous film 41 of the multilayer-structured film is removed.

For the interconnect material, a similar material to that described in the first embodiment is used. When Cu or Cu alloy is used as the interconnect material, it is preferable to form the upper-layer interconnections in the via holes and the interconnect trenches so that each upper-layer interconnection is wrapped in the electrically conductive barrier film. For the electrically conductive barrier film, for example, Ta film, TaN film, Ti film, or the like may be used.

According to the second embodiment, the following operations and effects are achieved.

The upper-layer interconnections of dual damascene structures are formed in the interlayer insulating films including first and second porous films 36 and 40, which are fragile and easy to be changed in properties. The dual damascene structures according to the second embodiment are highly reliable. It is possible to manufacture a semiconductor device in which interline capacitance, which is attributable to first non-porous film 37 functioning as an etching stopper, is reduced. Specifically, there are following operations and effects.

1) In the dry etching process to form the interconnect trenches, it is possible to use the second layer of the first non-porous film as an etching stopper for the first porous film. When the interconnect trenches are selectively formed by dry etching the second non-porous film and the second porous film, a change in properties of the first porous film, and unnecessary excessive etching can be avoided.

The first and second porous films are used as interlayer insulating films. After the via holes and the interconnect trenches are formed in these interlayer insulating films, the protective film is exposed at the bottoms of the via holes. In the dry etching process to remove this protective film, it is possible to use the second layer of the first non-porous film as an etching stopper for the first porous film at the bottoms of the interconnect trenches. In the dry etching process to remove the resist mask, it is possible to use the first layer of the first non-porous film as an etching stopper for the first porous film at the bottoms of the interconnect trenches. In the two dry etching processes, the first porous film can be prevented from being exposed to the etching gases. A change in properties of the first porous film located at the bottoms of the interconnect trenches, and unnecessary excessive etching can be avoided.

Similarly to the first embodiment, in the dry etching processes to remove the resist masks and the protective film exposed at the bottoms of the via holes, and in the chemical-mechanical polishing process of excessive part of the interconnect material to form the upper-layer interconnections of dual damascene structures, the surface of the second porous film can be prevented from being changed in properties, from being etched, and from being roughened.

It is possible to manufacture a semiconductor device in which highly reliable multilayer interconnections of dual damascene structures are formed in the interlayer insulating films including the first and second porous films, which are fragile and easy to be changed in properties.

2) Similarly to the first embodiment, it is possible to manufacture a semiconductor device in which interline capacitance is effectively reduced. It becomes possible to further reduce the interline capacitance by forming the second layer of the first non-porous film with low-k polyarylene ether, which has a relative dielectric constant of about 4.0.

3) During the dry etching processes to form the via holes and the interconnect trenches, the surfaces of the embedded interconnections in the insulating film are covered with the protective film. This can prevent the surfaces of the embedded interconnections from being exposed to the etching gases, and thus from being roughened.

In the step of removing the resist mask in the state where the protective film exposed at the bottoms of the via holes has already been removed and the surfaces of the embedded interconnections are exposed, it is possible to prevent the surfaces of the embedded interconnections from being roughened by using an etching gas of nitrogen, hydrogen, ammonia, or a combination thereof in the dry etching process.

It is possible to manufacture a semiconductor device in which the via plugs of the upper-layer interconnections are electrically connected to the embedded interconnections (lower-layer interconnections) in good condition.

(Third Embodiment)

A semiconductor device according to a third embodiment of the present invention includes lower-layer interconnections which are formed on a semiconductor substrate with an insulating film interposed therebetween. Surfaces of lower-layer interconnections are partially exposed. A protective film is formed on a surface of the insulating film including exposed portions of the interconnections. A first porous film, a first non-porous film, a second porous film, and further a second non-porous film if needed, are stacked on a surface of the protective film in this order, thus constituting a multilayer-structured film.

The first non-porous film is a multilayer film including at least two layers. Any one of the two layers is made of a material which has a high etching selectivity ratio relative to the protective film. A lower layer of the two layers located at a first porous film side is made of a material which has a high etching selectivity ratio relative to an upper layer located at a second porous film side. The upper layer is made of a material which has a high etching selectivity ratio relative to the second porous film.

Upper-layer interconnections of dual damascene structures are formed in the multilayer-structured film and the protective film, and include via plug parts and interconnect parts. The via plug parts are formed within via holes in the protective film and the first porous film with a boundary of the first non-porous film, and connected to the lower-layer interconnections. The interconnect parts are formed within interconnect trenches in the second porous film and the second non-porous film with the boundary of the first non-porous film, and connected to the via plug parts.

The protective film, the first and second porous films, and the second non-porous film can be formed by similar methods to those described in the first embodiment.

For the first non-porous film, specifically, the following two forms can be adopted.

(1) A multilayer film formed by stacking an upper layer on a lower layer. The upper layer is made of a material which has a high etching selectivity ratio relative to the second porous film. The lower layer is made of a material which has a high etching selectivity ratio relative to the upper layer and the protective film.

For the material which has a high etching selectivity ratio relative to the protective film, polyarylene ether or the like can be taken as an example.

For the material which has a high etching selectivity ratio relative to the second porous film, SiCH, SiCN, SiCO, SiN, organic siloxane, inorganic siloxane, or the like can be taken as an example.

(2) A multilayer film formed by stacking an upper layer on a lower layer. The upper layer is made of a material which has a high etching selectivity ratio relative to the protective film and the second porous film. The lower layer is made of a material which has a high etching selectivity ratio relative to the upper layer.

For the material which has a high etching selectivity ratio relative to the protective film and the second porous film, polyarylene ether or the like can be taken as an example.

For the material which has a high etching selectivity ratio relative to the upper layer, SiCH, SiCN, SiCO, SiN, organic siloxane, inorganic siloxane, or the like can be taken as an example.

According to the third embodiment, the upper-layer interconnections of dual damascene structures are included in the interlayer insulating films constituted of the first and second porous films, which are fragile and easy to be-changed in properties. The dual damascene structures according to the third embodiment are highly reliable. It is possible to provide a semiconductor device in which interline capacitance, which is attributable to the first non-porous film, is reduced.

Although the single-layered protective film and the single-layered second non-porous film are used in each of the first to third embodiments, the protective film and the second non-porous film may be multilayer films with two or more layers of different kinds.

Although the first non-porous film has a two-layered structure in each of the first to third embodiments, the first non-porous film may have a multilayer structure with three or more layers. An increase in the number of layers of the first non-porous film will involve an increase in interline capacitance due to an increase in the thickness of the film. The increase in the number of layers of the first non-porous film will involve an increase in the number of process steps in forming the film and in processing the shapes of the upper-layer interconnections. The increase in the number of layers of the first non-porous film will involve a complication of control on interfaces between each layer. Accordingly, it is preferable that the number of layers of the first non-porous film will be smaller.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A method of manufacturing a semiconductor device, comprising:
   forming a lower-layer interconnection;
   forming a protective film on a surface of the lower-layer interconnection;
   forming a multilayer-structured film by stacking a first porous film, a first non-porous film, a second porous film, and a second non-porous film on a surface of the protective film in this order;
   forming a via hole in the first porous film and the first non-porous film, and forming an interconnect trench communicating with the via hole in the second porous film and the second non-porous film, by dry etching the multilayer-structured film using a resist mask;
   removing the resist mask;
   removing the protective film exposed at a bottom of the via hole after removing the resist mask; and
   forming an upper-layer interconnection of dual damascene structure by embedding an interconnect material in the via hole and the interconnect trench, the upper-layer interconnection being connected to the lower-layer interconnection,
   wherein for the first non-porous film, used is a multilayer film including at least two layers in which a first layer, which is located close to the first porous film, is made of a material that has a high etching selectivity ratio relative to the protective film, and a second layer, which is located closer to the second porous film than the first layer is, is made of a material that has a high etching selectivity ratio relative to the resist mask and the second porous film.

2. The method according to claim 1, wherein the first non-porous film is formed by stacking a lower layer and an upper layer thereon, the upper layer is made of a material which has a high etching selectivity ratio relative to the second porous film and the resist mask, and the lower layer is made of a material which has a high etching selectivity ratio relative to the protective film.

3. The method according to claim 1, wherein the first non-porous film is formed by stacking two or more layers including at least a lower layer and an upper layer, the upper layer is made of a material which has a high etching selectivity ratio relative to the second porous film, the lower layer is made of a material which has a high etching selectivity ratio relative to the upper layer, and any one layer of the multilayer film including two or more layers is made of a material which has a high etching selectivity ratio relative to the protective film.

4. A method of manufacturing a semiconductor device, comprising:
   forming a lower-layer interconnection;
   forming a protective film on a surface of the lower-layer interconnection;
   forming a multilayer-structured film by stacking a first porous film, a first non-porous film, a second porous film, and a second non-porous film on a surface of the protective film in this order;
   forming a via hole in the first porous film and the first non-porous film, and forming an interconnect trench communicating with the via hole in the second porous film and the second non-porous film, by dry etching the multilayer-structured film using a resist mask;
   removing the protective film exposed at a bottom of the via hole;
   removing the resist mask after removing the protective film; and
   forming an upper-layer interconnection of dual damascene structure by embedding an interconnect material in the via hole and the interconnect trench, upper-layer interconnection being connected to the lower-layer interconnection,
   wherein for the first non-porous film, used is a multilayer film including at least two layers in which a first layer, which is located close to the first porous film, is made of a material that has a high etching selectivity ratio relative to the resist mask, and a second layer, which is located closer to the second porous film than the first layer is, is made of a material that has a high etching selectivity ratio relative to the protective film and the second porous film.

5. The method according to claim 4, wherein the first non-porous film is formed by stacking a lower layer and an upper layer thereon, the upper layer is made of a material which has a high etching selectivity ratio relative to the protective film and the second porous film, and the lower layer is made of a material which has a high etching selectivity ratio relative to the resist mask.

6. The method according to claim 4, wherein the first non-porous film is formed by stacking two or more layers including at least a lower layer and an upper layer, the upper layer is made of a material which has a high etching selectivity ratio relative to the second porous film, the lower layer is made of a material which has a high etching selectivity ratio relative to the upper layer, and any one layer of the multilayer film including two or more layers is made of a material which has a high etching selectivity ratio relative to the protective film.

7. A semiconductor device, comprising:
   a lower-layer interconnection formed on a semiconductor substrate with an insulating film interposed therebetween;
   a protective film formed on a surface of the insulating film, including on the lower-layer interconnection;
   a multilayer-structured film formed by stacking at least a first porous film, a first non-porous film, and a second porous film on a surface of the protective film in this order; and an upper-layer interconnection of dual damascene structure formed in the protective film and the multilayer-structured film, the upper-layer interconnection including a via plug part connected to the lower-layer interconnection and an interconnect part connected to the via plug part with a boundary of the first non-porous film, wherein the first non-porous film has a multilayer structure with a lower layer and an upper layer stacked thereon, and the upper layer is made of a material which has a high etching selectivity ratio relative to the protective film the lower layer is made of a material which has a high etching selectivity ratio relative to the upper layer, and the upper layer is made of a material which has a high etching selectivity ratio relative to the second porous film.

8. The semiconductor device according to claim 7, wherein the upper layer included in the first non-porous film is a polyarylene ether film.

9. The semiconductor device according to claim 8, wherein the lower layer included in the first non-porous film is any one of SiCH film, SiCN film, SiCO film, SiN film, organic siloxane film, and inorganic siloxane film.

10. The semiconductor device according to claim 7, wherein among the layers in the multilayer film constituting the first non-porous film, the layer made of the material which has a high etching selectivity ratio relative to the protective film, is a polyarylene ether film.

11. The semiconductor device according to claim 7, wherein the protective film is any one of SiCH film, SiCN film, SiCO film, and SiN film.

12. The semiconductor device according to claim 7, wherein at least one of the first and second porous films is any one of porous organic siloxane film and porous inorganic siloxane film.

13. The semiconductor device according to claim 7, wherein at least one of the first and second porous films is porous polyarylene ether film.

14. The semiconductor device according to claim 7, wherein the first non-porous film is thinner than the protective film.

15. The semiconductor device according to claim 7, wherein the multilayer-structured film has a multilayer structure in which the first porous film, the first non-porous film, the second porous film, and a second non-porous film are stacked in this order.

16. The semiconductor device according to claim 15, wherein the second non-porous film is any one of organic siloxane film and inorganic siloxane film.

* * * * *

UNITED STATES PATENT AND TRADEMARK OFFICE
CERTIFICATE OF CORRECTION

PATENT NO. : 6,962,870 B2
DATED : November 8, 2005
INVENTOR(S) : Masuda et al.

It is certified that error appears in the above-identified patent and that said Letters Patent is hereby corrected as shown below:

Column 19,
Line 12, change "film the" to -- film, the --.

Signed and Sealed this

Thirty-first Day of January, 2006

JON W. DUDAS
*Director of the United States Patent and Trademark Office*